United States Patent [19]
Faraci et al.

[11] Patent Number: 5,798,286
[45] Date of Patent: *Aug. 25, 1998

[54] CONNECTING MULTIPLE MICROELECTRONIC ELEMENTS WITH LEAD DEFORMATION

[75] Inventors: Tony Faraci, Georgetown, Tex.; Thomas H. DiStefano, Monte Sereno; John W. Smith, Palo Alto, both of Calif.

[73] Assignee: Tessera, Inc., San Jose, Calif.

[ * ] Notice: The term of this patent shall not extend beyond the expiration date of Pat. No. 5,518,964.

[21] Appl. No.: 532,528

[22] Filed: Sep. 22, 1995

[51] Int. Cl.[6] .................................................. H01L 21/44
[52] U.S. Cl. ................................. 438/113; 438/126
[58] Field of Search ............................ 438/107, 108, 438/113, 144, 126

[56] References Cited

U.S. PATENT DOCUMENTS

| Re. 35,119 | 12/1995 | Blonder et al. |
|---|---|---|
| 3,373,481 | 3/1968 | Lins et al. |
| 3,795,037 | 3/1974 | Luttmer |
| 3,811,186 | 5/1974 | Larnerd et al. |
| 3,825,353 | 7/1974 | Loro |
| 3,842,189 | 10/1974 | Southgate |
| 3,952,404 | 4/1976 | Matunami |
| 4,067,104 | 1/1978 | Tracy |
| 4,142,288 | 3/1979 | Flammer et al. |

(List continued on next page.)

FOREIGN PATENT DOCUMENTS

| 072673 A2 | of 0000 | European Pat. Off. |
|---|---|---|
| 0 352 020 A3 | 1/1990 | European Pat. Off. |
| 0 433 997 A2 | 6/1991 | European Pat. Off. |
| 6191939 | of 0000 | Japan |
| 1-155633 | 6/1989 | Japan |
| 3-198734 | 5/1991 | Japan |
| 2142568 | of 0000 | United Kingdom |
| 2151529 | of 0000 | United Kingdom |
| WO 94/03036 | 2/1994 | WIPO |
| WO 96/02068 | 1/1996 | WIPO |

OTHER PUBLICATIONS

IBM Technical Disclosure Bulletin, vol. 36, No. 07, Jul. 1993.
Research Disclosure No. 322 (Feb. 1991) "Method of Testing Chips and Joining Chips to Substrates," XP 000169195.

*Primary Examiner*—Kevin Picardat
*Attorney, Agent, or Firm*—Lerner, David, Littenberg, Krumholz & Mentlik

[57] ABSTRACT

A plurality of separate semiconductor chips, each having a contact-bearing surface and contacts on such surface, are disposed in an array so that the contact-bearing surfaces face and define a first surface of the array. A flexible, dielectric sheet with terminals thereon overlies the first or contact bearing surface of the semiconductor chips. Elongated leads are disposed between the dielectric element and the semiconductor chips. Each lead has a first end connected to a terminal on the dielectric element, and a second end connected to a contact on a semiconductor chip in the array. All of the leads are formed simultaneously by moving the dielectric element and the array relative to one another to simultaneously displace all of the first ends of the leads relative to all of the second ends. The dielectric element is subdivided after the forming step so as to leave one region of the dielectric element connected to each chip and thereby form individual units each including one chip, or a small number of chips.

26 Claims, 11 Drawing Sheets

U.S. PATENT DOCUMENTS

| | | |
|---|---|---|
| 4,326,663 | 4/1982 | Oettel . |
| 4,447,857 | 5/1984 | Marks et al. . |
| 4,520,562 | 6/1985 | Sade et al. . |
| 4,629,957 | 12/1986 | Walters et al. . |
| 4,661,192 | 4/1987 | McShane . |
| 4,667,219 | 5/1987 | Lee et al. . |
| 4,721,995 | 1/1988 | Tanizawa . |
| 4,751,199 | 6/1988 | Phy . |
| 4,785,137 | 11/1988 | Samuels . |
| 4,793,814 | 12/1988 | Zifcak et al. . |
| 4,812,191 | 3/1989 | Ho et al. . |
| 4,893,172 | 1/1990 | Matsummoto et al. . |
| 4,926,241 | 5/1990 | Carey . |
| 4,937,653 | 6/1990 | Blonder et al. . |
| 4,949,158 | 8/1990 | Ueda . |
| 4,954,877 | 9/1990 | Nakanishi et al. . |
| 4,955,523 | 9/1990 | Calomagno et al. . |
| 5,047,830 | 9/1991 | Grabbe . |
| 5,049,085 | 9/1991 | Reylek et al. . |
| 5,055,907 | 10/1991 | Jacobs . |
| 5,057,460 | 10/1991 | Rose . |
| 5,067,007 | 11/1991 | Kanji et al. . |
| 5,086,337 | 2/1992 | Noro et al. . |
| 5,131,852 | 7/1992 | Grabbe et al. . |
| 5,148,265 | 9/1992 | Khandros et al. . |
| 5,148,266 | 9/1992 | Khandros et al. . |
| 5,152,695 | 10/1992 | Grabbe et al. . |
| 5,166,099 | 11/1992 | Ueda et al. . |
| 5,173,055 | 12/1992 | Grabbe . |
| 5,192,716 | 3/1993 | Jacobs . |
| 5,197,892 | 3/1993 | Yoshizawa et al. . |
| 5,210,939 | 5/1993 | Mallik et al. . |
| 5,230,931 | 7/1993 | Yamazaki et al. . |
| 5,254,811 | 10/1993 | Ludden et al. . |
| 5,286,680 | 2/1994 | Cain . |
| 5,346,861 | 9/1994 | Khandros et al. . |
| 5,430,614 | 7/1995 | Difrancesco . |
| 5,455,390 | 10/1995 | DiStefano et al. . |
| 5,518,964 | 5/1996 | DiStefano et al. ............. 438/107 |
| 5,528,083 | 6/1996 | Malladi et al. . |
| 5,597,470 | 1/1997 | Karavakis et al. . |
| 5,629,239 | 5/1997 | DiStefano et al. . |

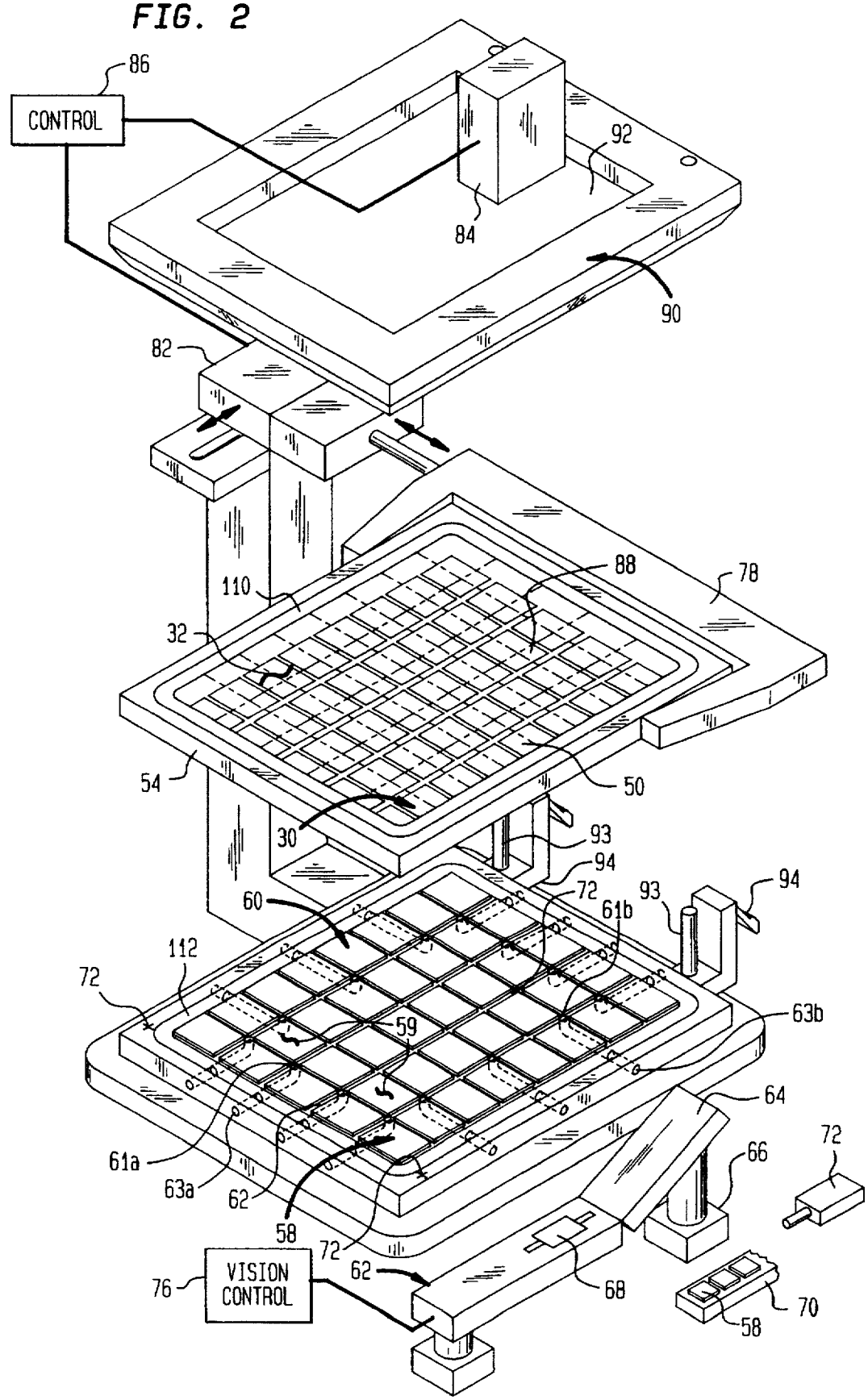

5,798,286

CONNECTING MULTIPLE MICROELECTRONIC ELEMENTS WITH LEAD DEFORMATION

Cross Reference To Related Applications

The disclosure of United States patent application Ser. No. 08/271,768 is incorporated by reference herein.

FIELD OF THE INVENTION

The present invention relates to mounting and connection devices and techniques for use with microelectronic elements such as semiconductor chips.

Background Of The Invention

Complex microelectronic devices such as modern semiconductor chips require numerous connections to other electronic components. For example, a complex microprocessor chip may require many hundreds of connections to external devices.

Semiconductor chips commonly have been connected to electrical traces on mounting substrates by one of three methods: wire bonding, tape automated bonding, and flip-chip bonding. In wire bonding, the semiconductor chip is positioned on a substrate with a bottom or back surface of the chip abutting the substrate and with the contact-bearing front or top surface of the chip facing upwardly, away from the substrate. Individual gold or aluminum wires are connected between the contacts on the semiconductor chip and current conducting pads on the substrate. In tape automated bonding a flexible dielectric tape with a prefabricated array of leads thereon is positioned over the semiconductor chip and substrate, and the individual leads are bonded to the contacts on the chip and to the current conducting pads on the substrate. In both wire bonding and conventional tape automated bonding, the current conducting pads on the substrate are arranged outside of the area covered by the semiconductor chip, so that the wires or leads fan out from the chip to the surrounding current conducting pads. The area covered by the subassembly as a whole is considerably larger than the area covered by the chip. This makes the entire assembly substantially larger than it otherwise would be. Because the speed with which a microelectronic assembly can operate is inversely related to its size, this presents a serious drawback. Moreover, the wire bonding and tape automated bonding approaches are generally most workable with semiconductor chips having contacts disposed in rows extending along the periphery of the chip. They generally do not lend themselves to use with chips having contacts disposed in a so-called area array, i.e., a grid-like pattern covering all or a substantial portion of the chip front surface.

In the flip-chip mounting technique, the contact bearing surface of the semiconductor chip faces towards the substrate. Each contact on the semiconductor chip is joined by a solder bond to the corresponding current carrying pad on the substrate, as by positioning is solder balls on the substrate or contacts of the semiconductor chip, juxtaposing the chip with the substrate in the front-face-down orientation and momentarily melting or reflowing the solder. The flip-chip technique yields a compact assembly, which occupies an area of the substrate no larger than the area of the chip itself. However, flip-chip assemblies suffer from significant problems with thermal stress. The solder bonds between the contacts on the semiconductor chip and the current carrying pads on the substrate are substantially rigid. Changes in the size of the chip and of the substrate due to thermal expansion and contraction in service create substantial stresses in these rigid bonds, which in turn can lead to fatigue failure of the bonds. Moreover, it is difficult to test the semiconductor chip before attaching it to the substrate, and hence difficult to maintain the required outgoing quality level in the finished assembly, particularly where the assembly includes numerous semiconductor chips.

Numerous attempts have been made to solve the foregoing problem. Useful solutions are disclosed in commonly assigned U.S. Pat. Nos. 5,148,265 and 5,148,266. Preferred embodiments of the structures disclosed in these patents incorporate flexible, sheet-like structures referred to as "interposers" or "chip carriers." The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. Most preferably, this connection is made by bonding prefabricated leads on the interposer to the contacts on the semiconductor chip, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the semiconductor chip without imposing significant stresses on the bonds between the leads and the contacts on the semiconductor chip, or on the bonds between the terminals of the chip carrier and the substrate. Thus, is the assembly can compensate for thermal effects. Moreover, the assembly most preferably includes a compliant layer disposed between the terminals on the chip carrier and the face of the semiconductor chip itself as, for example, an elastomeric layer incorporated in the chip carrier and disposed between the dielectric layer of the chip carrier and the semiconductor chip. Such a compliant structure permits displacement of the individual terminals independently towards the chip. This permits effective engagement between the subassembly and a test fixture. Thus, a test fixture incorporating numerous electrical contacts can be engaged with all of the terminals in the subassembly despite minor variations in the height of the terminals. The subassembly can be tested before it is bonded to a substrate so as to provide a tested, known, good part to the substrate assembly operation. This in turn provides very substantial economic and quality advantages.

Co-pending, commonly assigned U.S. patent application Ser. No. 08/190,779 describes a further improvement. Components according to preferred embodiments of the '779 application use a flexible, dielectric top sheet having top and bottom surfaces. A plurality of terminals are mounted on the top sheet. A support layer is disposed underneath the top sheet, the support layer having a bottom surface remote from the top sheet. A plurality of electrically conductive, elongated leads are connected to the terminals on the top sheet and extend generally side by side downwardly from the terminals through the support layer. Each lead has a lower end at the bottom surface of the support layer. The lower ends of the leads have conductive bonding materials as, for example, eutectic bonding metals. The support layer surrounds and supports the leads.

Components of this type can be connected to microelectronic elements such as semiconductor chips or wafers by juxtaposing the bottom surface of the support layer with the contact-bearing surface of the semiconductor chip so as to bring the lower ends of the leads into engagement with the contacts on the chip, and then subjecting the assembly to elevated temperature and pressure conditions. All of the lower is ends of the leads bond to the contacts on the semiconductor chip substantially simultaneously. The bonded leads connect the terminals of the top sheet with the contacts on the semiconductor chip. The support layer desirably is either formed from a relatively low-modulus, compliant material, or else is removed and replaced after the lead bonding step with such a compliant material. In the finished assembly, the terminals on the relatively flexible dielectric top sheet desirably are movable with respect to the contacts on the semiconductor chip to permit testing and to compensate for thermal effects. However, the components and methods of the '779 application provide further advantages, including the ability to make all of the bonds to the chip or other component in a single lamination-like process step. The components and methods of the '779 application are especially advantageous when used with semiconductor chips or other microelectronic elements having contacts disposed in an area array.

Commonly assigned, co-pending U.S. patent application Ser. No. 08/271,768 (the "'768 application") discloses still further improvements. Preferred methods according to the '768 application include the steps of providing a dielectric connection component or first element having a first surface with a plurality of terminals and a corresponding plurality of elongated, flexible leads extending along the first surface, each such lead having a terminal end attached to one of the terminals on the first element and a tip end offset from the terminal end in a generally horizontal direction parallel to the first surface. Desirably, the tip ends of all the leads are attached to an associated one of the contacts on a second element. The preferred methods also include the step of simultaneously forming all of the leads by moving all of the tip ends of the leads relative to the terminal ends thereof and relative to the first element so as to bend the tip ends away from the first element. Desirably the step of moving the tip ends of the respective leads relative to their terminal ends includes the step of moving the second element relative to the first element. The first and second elements desirably move in a vertical direction, away from one another, and may also move in horizontal directions parallel to the operatively related surfaces of the elements so as to bend the tip end of each lead horizontally towards its own terminal end and vertically away from the terminal end. The net effect is to deform the leads towards formed positions in which the leads extend generally vertically downwardly, away from the first element. Methods according to this aspect of the present invention may include the step of injecting a flowable, desirably compliant dielectric material around the leads after the lead-forming step and then curing the flowable material so as to form a dielectric support layer around the leads.

In particularly preferred methods according to the '768 application, one element is a flexible, dielectric top sheet having terminal structures thereon, and the other element includes one or more semiconductor chips. The resulting assembly thus includes the dielectric top sheet with the terminal structures connected to the associated contacts of the semiconductor chip or chips by the vertically-extending, curved flexible leads, the dielectric top sheet being spaced apart from the semiconductor chip or chips by the dielectric support layer. The terminal structures can be connected to a substrate such as a circuit panel to thereby provide electrical current communication to the contacts on the semiconductor chip or chips. Each terminal structure on the dielectric top sheet is movable with respect to the contacts in the semiconductor chip in horizontal directions parallel to the chip, to take up differences in thermal expansion between the chip and substrate, as well as in vertical directions towards and away from the dielectric top sheet, to facilitate testing and assembly. In these respects, the resulting assembly provides advantages similar to those achieved by preferred assemblies according to the aforementioned U.S. Pat. Nos. 5,148,265 and 5,148,266.

In the preferred processes of the '768 application, one element may be a multi-chip unit such as a wafer incorporating a plurality of semiconductor chips having contacts thereon, and the other element may be a dielectric sheet extending over the plurality of these semiconductor chips so that the sheet includes a plurality of regions, one such region corresponding to each such chip. In this arrangement, the step of attaching the tip ends of the leads to the contacts on the second element, in this case a semiconductor chip, preferably includes the step of bonding the tip ends of leads in a plurality of such regions, and desirably in all of such regions, to the contacts on the semiconductor chips or to the terminal structures on the dielectric top sheet simultaneously so that each such region is connected to one chip. The method may further include the steps of injecting a flowable dielectric material between the wafer having the semiconductor chips and the dielectric top sheet and curing the dielectric material to form a compliant dielectric support layer during or after the moving step, and subsequently severing the chips from the multi-chip element or wafer and severing the regions from the sheet so as to form individual units, each including a chip and the associated region of the sheet.

The step of attaching the tip ends of the leads to the second element desirably includes the step of bonding the tip ends of the leads to the contacts on the semiconductor chip or chips or to the terminal structures of the dielectric top sheet while the leads are in their initial, undeformed positions. Thus, all of the tip ends are bonded simultaneously to the chip contacts or to the terminal structures on the dielectric top sheet. A single simultaneous bonding operation may bond thousands of leads. Because the leads are in their initial, undeformed positions when bonded to the contacts, the positions of the lead tips are well controlled at this stage. This facilitates registration of the lead tips with the terminal structures on the dielectric top sheet or contacts on the semiconductor chips.

The '768 application discloses certain processes in which the multi-chip unit incorporates an assembly of separate chips, such as chips previously severed from wafers, mounted to a common support.

The present invention shows an improved method and apparatus for incorporating a plurality of independent and separate semiconductor chips with an associated connection component and a support or holding substrate to form a mechanical wafer array so connected that the semiconductor chips and components can be tested and then the mechanically formed wafer array can be severed into independent semiconductor chip units or into assemblies of more than one semiconductor chip.

SUMMARY OF THE INVENTION

One aspect of the present invention provides methods of making semiconductor chip assemblies. Methods according to this aspect of the invention desirably include the steps of a plurality of separate semiconductor chips, each having a contact-bearing surface and contacts on such surface. The chips are disposed in an array so that the respective contact-bearing surfaces face in a common direction and define a first surface of the array. Preferably, the contact-bearing surfaces are substantially co-planar with one another. A connection component such as a flexible, dielectric sheet with terminals thereon, is also provided, so that the dielectric sheet overlies the contact-bearing surfaces of the chips in the array. A plurality of elongated metallic leads are provided between the dielectric element and the respective first or contact bearing surfaces of the semiconductor chips in the array. Each lead has a first end secured to a terminal on the dielectric sheet and a second end fastened to a contact on the first or contact bearing surface of a semiconductor chip in the array. The chips may be retained in the array on a support or holding element.

The method further includes the step of forming the leads by moving the dielectric top sheet or connection component and the semiconductor chips in the array relative to one another to simultaneously displace all of the first ends of the leads relative to all of the second ends, and preferably, to form all of the leads into generally vertically extending, desirably curved configurations. The method most preferably further includes the step of subdividing the dielectric sheet after the forming step as to leave one separated region of the dielectric top sheet connected to one of the associated semiconductor chips, or a small number of chips, and thereby form individual units each including at one semiconductor chip, or a small number of semiconductor chips and an associated region of the dielectric top sheet.

The step of providing the chips in the array may include the step of removably mounting or placing the individual semiconductor chips onto the support or holding element so that the first or contact bearing surface of each chip faces away from the holding element. The dielectric top sheet is aligned with this pre-formed array by aligning the entire sheet with the support or holding element so that each region of the dielectric top sheet or connection component is aligned with one semiconductor chip, the terminals on each region of the dielectric top sheet being connected by the leads to the contacts on the aligned semiconductor chip.

Alternatively, the array of chips can be formed by bonding individual chips to the various regions of the dielectric sheet. Each chip may be independently aligned with the associated region of the sheet, and may be bonded to leads in such region. After all of the chips are bonded to the sheet, the chips may be engaged with the holding element.

Preferred methods according to this aspect of the invention provide several advantages. Because separate chips are employed, the chips can be pretested and bad chips can be eliminated from the process. Moreover, bad areas of the dielectric sheet can be identified by pretesting the sheet. The chips which would normally be associated with these areas can be omitted. The size of the wafer array that is formed may be larger or smaller than the size of an individual wafer. Moreover, the spacing between chips can be greater than that provided in the wafer. This alleviates problems in bonding and in the severing step. Further, the contacts on the chips may be aligned precisely with the terminals on the top sheet. Such precise alignment allows the process to be used even where the contacts on the chip are closely spaced, at a small contact pitch.

Further aspects of the present invention provide semiconductor chip arrays including a holding element and a plurality of separate chips each having a contact-bearing surface with electrical contacts thereon. The chips are secured in an array on the holding element so that the contact-bearing surfaces face upwardly away from the holding element and thereby define a first surface of the array, with the contacts exposed at the first surface. The semiconductor chips are mounted at preselected positions on the holding element so that the contacts on the chips are disposed at preselected locations relative to one another. Semiconductor chip arrays according to these aspects of the invention can be used in the aforementioned processes.

Further aspects of the invention provide apparatus for securing semiconductor chips to a sheet. Apparatus according to this aspect of the invention preferably includes a plurality of chip-side elements, each said chip-side element including means for holding a plurality of chips, and a plurality of sheet-side elements, each said sheet-side element including means for holding a dielectric sheet. The apparatus preferably further includes means for securing said sheet-side and chip-side elements to one another to form cartridges, each said cartridge including one chip-side and one sheet-side element. A movement station includes means for moving the sheet-side and chip-side elements of a cartridge relative to one another through a preselected motion to thereby displace the chips carried by the chip-side element and the sheet carried by the sheet-side element relative to one another. The apparatus preferably further includes means for presenting the cartridges seriatim to said movement station with said chips and sheets therein and with said chips and sheets connected one another by leads extending between said chips and said sheets. Thus, the leads will be deformed upon said movement in said movement station.

The apparatus may also include means for injecting a curable material between the chips and sheet carried in each said cartridge, and a storage element adapted to hold a plurality of cartridges. Thus, many sheet and chip assemblies can be held after injection for curing, while other sheet and chip assemblies are processed at the movement station. The storage element may include a heated storage region.

The means for presenting may include chip attach means for accepting a plurality of separate semiconductor chips, securing said chips to a dielectric sheet held by one said sheet-side element and bonding is leads carried by the chips or the sheet so as to connect the leads between the chips and sheet. The means for presenting may further include means for engaging one said chip-side element with the chips secured to a sheet. The chip attach means may include a chuck for temporarily holding a chip, a heater for heating the chuck to thereby the chip, and means for moving the chuck relative to a sheet so as to register a chip held by said chuck with the sheet and means for advancing the chuck towards the sheet to thereby advance the chip into engagement with the sheet.

These and other objects, features and advantages of the present invention will be more readily apparent from the detailed description of the preferred embodiments set forth below, taken in conjunction with the accompanying drawings.

BRIEF DESCRIPTION OF THE DRAWINGS

FIG. 2 is a diagrammatic perspective view illustrating certain apparatus used in the process of FIG. 1.

DETAILED DESCRIPTION OF THE PREFERRED EMBODIMENTS

Figure 4:
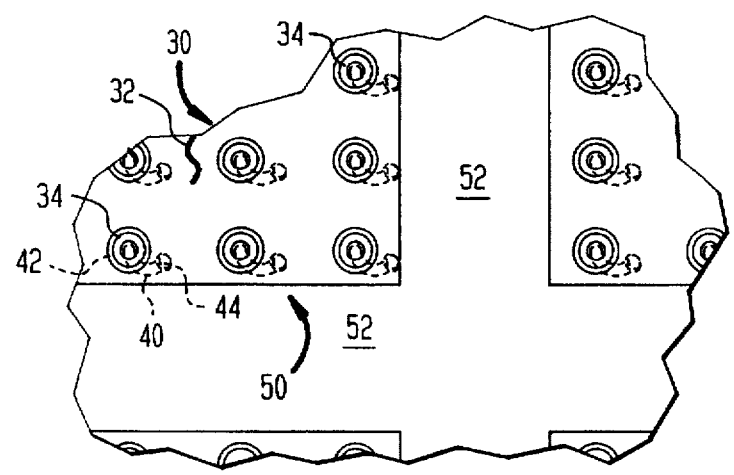
FIG. 4 is a view similar to FIG. 3A but depicting a additional components used with the components of FIG. 3A.

A process in accordance with one embodiment of the present invention begins with a dielectric sheet element 30 (FIGS. 2, 4 and 5) having a top surface 32 with a conductive layer thereon and also having a plurality of terminals 34 disposed on the top surface of the dielectric sheet 30 but isolated from conductive layer 32. Each terminal has a conductive via liner 36 (FIG. 5) extending through sheet 30 to the bottom surface 33 of the sheet. A lead 40 is connected to each via liner 36 and hence to each terminal 34. The terminal end 42 of each such end is permanently bonded to the via liner and secured to the sheet by the via liner and terminal, whereas the tip end 44 of each lead, remote from the terminal, is releasably attached to sheet 30 by a small, weakly bonded attachment element or button 46. Each lead is also provided with a heat activatable bonding material 48 at its terminal end. As best seen in FIG. 4, each lead 40 is curved in horizontal directions parallel to the surface of sheet 30 between its terminal end 42 and its tip end 44.

The structure and fabrication of these leads may be substantially as shown and described in the aforementioned, co-pending, commonly assigned U.S. patent application Ser. No. 08/271,768. Briefly, leads of this nature may be fabricated by providing a layer of copper or other readily etchable metal on the bottom surface of sheet 30, and depositing gold or other flexible, substantially etch-resistant metal in the form of the lead on the copper layer. Each deposited lead has a relatively large-diameter circular element at the terminal end and has a smaller diameter circular end element at the tip end, the width of the lead between these ends being smaller than the diameter of either circular element. Upon exposure to an etching solution, the etching solution attacks the copper layer in areas uncovered by the leads and by the circular end pieces. The etching solution also undercuts beneath the leads, leaving each lead substantially free from the sheet. The circular end piece of the tip end protects part of the underlying layer and thus forms button 46, and the corresponding circular end piece at the terminal end protects a part of the copper layer forming the connection between the terminal end and the via liner 36. The bonding material 48 may be a diffusion bonding or eutectic bonding material such as tin, silicon, geranium or combinations thereof, and may be applied by plating before or after the etching step.

The leads on sheet 30 are arranged in a plurality of regions 50. Within each region 50, the leads are arranged in a regular grid pattern, so that the tip ends 44 of the leads within each region 50 are disposed in rows and columns at spacings corresponding to the spacings of contacts on the chips to be assembled with the sheet. Regions 50 in turn are disposed in a regular pattern on the sheet with spaces referred to as scribe lands 52 disposed therebetween. Typically, the pitch or distance between adjacent leads in each region may be less than about 1.5 mm, and more preferably about 1.0 mm or less. Pitch less than 0.5 mm may be employed. In a first stage of the process, sheet 30 is stretched taut and then bonded to a frame 54 by means of a high temperature adhesive. Frame 54 desirably is formed from a material such as molybdenum having a coefficient of thermal expansion substantially equal to the coefficient of thermal expansion of the chips used in the process. Sheet 30 may be stretched taut first by bonding the margins of the sheet (not shown) to a an outer frame (not shown) larger than frame 54 while the sheet and outer frame are at a first cure temperature. After this preliminary bonding step, the outer frame, together with the sheet, is brought to an elevated second cure temperature preferably about 170° C. and held at such elevated temperature for a period of time sufficient for the sheet and outer frame to reach thermal equilibrium. The coefficient of expansion of the outer frame is substantially greater than that of the sheet, and hence the sheet is placed under substantial tension during the heating process. For example, the outer frame can be formed from aluminum or other metal having a high coefficient of expansion. Frame 54 is also brought to the same elevated temperature. While the sheet, outer frame and frame 54 are at the elevated temperature, frame 54 is bonded to the sheet using a high temperature adhesive, such as Dow Corning Q36611. The outer frame may then be removed by cutting the sheet. Because the coefficient of expansion of frame 54 is less than that of the outer frame, the sheet will remain in tension when the sheet and frame are cooled. Although frame 54 is illustrated as rectangular in the drawings, other shapes can be employed. In particular, circular frames are preferred for processes where the is pitch less than about 0.5 mm. Although the present invention is not limited by any theory of operation, it is believed that the circular frame applies more uniform tension to the sheet. The outer frame may also be circular.

In a separate operation, a plurality of individual, separate semiconductor chips 58 are assembled to a holding element or lower platen 60. A pick and place unit 65 is used for this purpose. Unit 65 may be of generally conventional construction, and includes an arm 64, a chuck 66 and actuators, schematically indicated at 68 for moving the arm and chuck over a range of motion encompassing a chip intake conveyor 70 and the lower platen 60. Unit 65 further includes a robot vision system 76 for detecting the actual position of each chip while the chip is held on chuck 66, and also for detecting the positions of fiducial markers 72 on the lower platen. Actuators 68 are responsive to signals from the robot vision system 76. The pick and place unit thus places each chip 58 onto bottom platen 60 in a position and orientation precisely registered with fiducial marks 72 on the bottom platen. The chips are placed in an array, with the contact-bearing or front surfaces 59 of all of the chips substantially coplanar and facing upwardly, away from lower platen 60. The chips are disposed at spaced apart locations with gutter spaces 62 therebetween. Before assembly to the lower platen, each chip is coated with an adhesive on its rear surface, and hence remains in place when placed on platen 60. In a variant of this embodiment, the bottom platen can be provided with a vacuum plenum and holes so that each chip can be held in engagement on the bottom platen by applied vacuum instead of adhesive; this arrangement may be similar to the select plate assembly discussed below with reference to FIGS. 8–11. Bottom platen 60 also has ports 61 opening to its top surface, these ports being connected through passages to openings 63 at the edges of the platen. Port 61 are arranged so that they fall in areas unoccupied by chips 58, such as the gutter spaces 62 between chips and the edges of the platen.

Figure 3A:
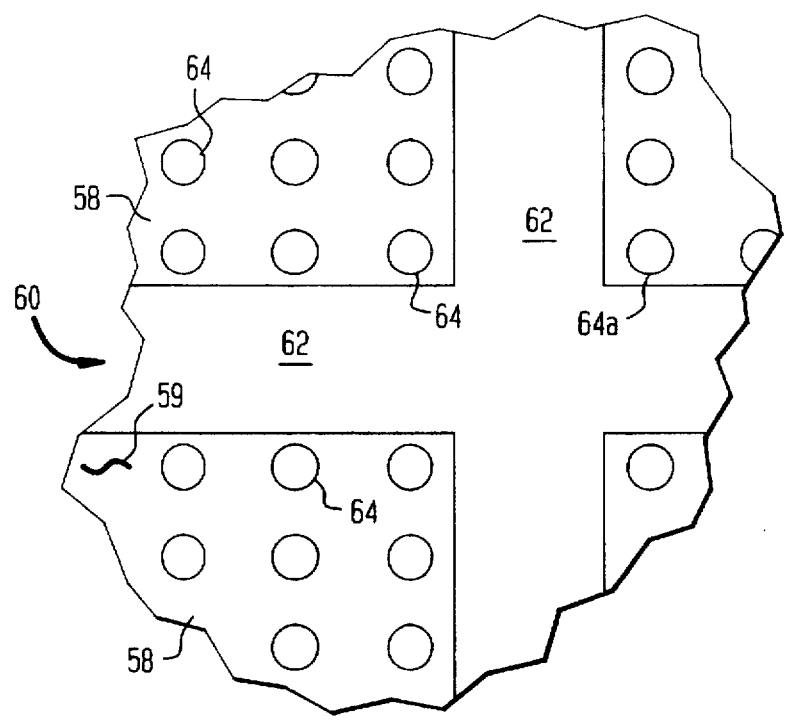
FIGS. 3A is a fragmentary plan view, on an enlarged scale, of components utilized in the process of FIG. 2.
Figure 3B:
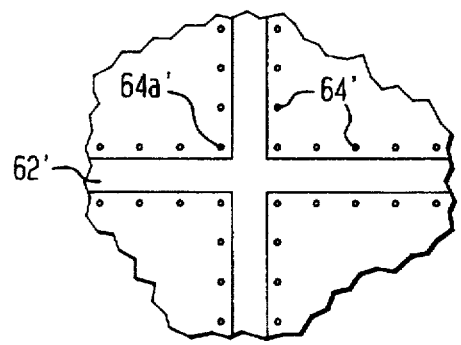
FIG. 3B is a view similar to FIG. 3A but depicting a different variant of the components illustrated.

Each chip 58 has contacts 64 disposed in a regular grid on the front surface 59 of the chip. The array of contacts on each chip corresponds to the array of lead tip regions 44 (FIG. 4) within each region 50 of the sheet. The array of contacts on each chip may be an area array as illustrated in FIG. 3A, with the contacts distributed at substantially regular intervals over the front face 59 of each chip. Alternatively, the array of contacts may include only rows of contacts 64' (FIG. 3B) along the edges of each chip. In either case, the array of contacts typically includes at least one contact 64a or 64a' adjacent each corner of each chip. Gutter spaces 62 provide substantial spaces between these corner contacts on adjacent chips. The gutter spaces 62 between the chips correspond to the scribe lands 52 between regions 50 on sheet 30. Preferably, each gutter space 62 has a width at least equal to the spacings between adjacent contacts on the same chip. Each gutter space may be at least about 1 mm and preferably at least about 1.5 mm. The gutter spaces may be substantially wider than the saw lanes or empty spaces left between adjacent chips when a wafer is formed. Normally, these spaces are made as narrow as possible so that as many chips as possible may be accommodated on a wafer of a given size during wafer fabrication. With such narrow spaces between adjacent chips, the contacts 64a at the corners of the chips would be clustered extremely close to one another. Such close placement could hinder the subsequent lead bonding operation discussed below.

In the next stage 80 of the process, frame 54 is aligned with bottom platen 60 using an alignment fixture 78 and a actuating system 82 controlled by a machine vision camera 84 and a control system 86. The machine vision system detects fiducial marks 88 on sheet 30 as well as fiducial marks 72 on the lower platen 60 and controls actuator 82 to move frame 54 and sheet 30 in horizontal directions, parallel to sheet 30 and parallel to the faces of chips 58. This movement is controlled to bring the fiducial marks into registration. Upon such registration, each region 50 of sheet 30 is registered with the corresponding chip 58, and the tip end 44 of each lead is registered with the corresponding contact 64 on the chip. A temporary top platen 90 having a transparent, preferably quartz center section 92 in alignment with sheet 30 is engaged with sheet 30 and with the bottom platen. Alignment pins 93, schematically depicted in FIG. 2, mate with holes at the edge of the top platen to secure the top platen against horizontal movement relative to the bottom platen and frame. The top platen bears on the sheet to hold it against movement relative to the chips. The completed assembly, also referred to as a cartridge, is conveyed to a heat bonding press (not shown) having a pair of opposed heated press plates housed in a heated enclosure or oven.

Figure 5:
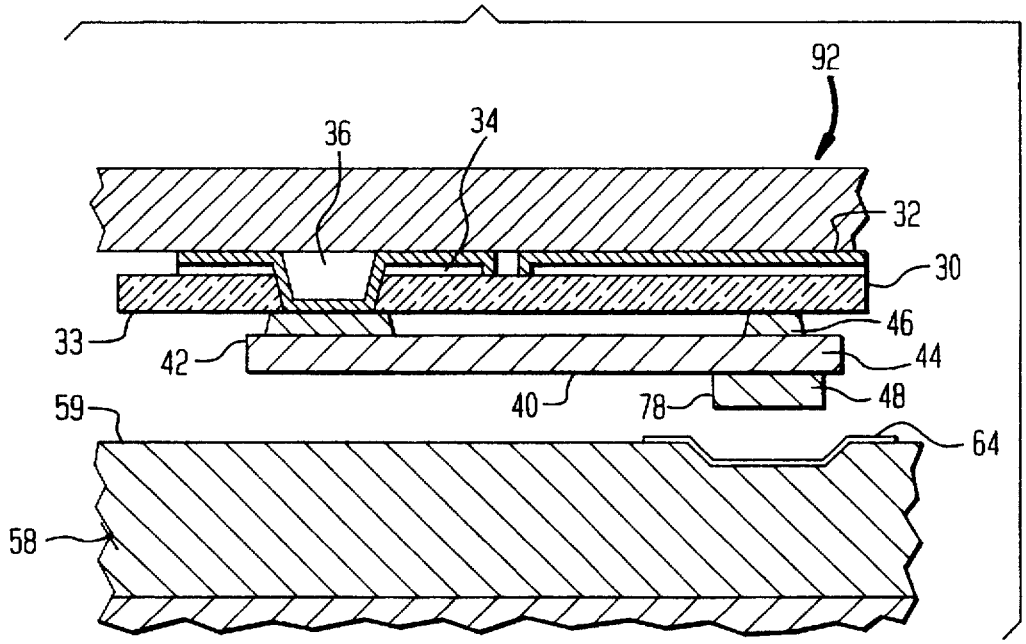
FIGS. 5, 6, and 7 are fragmentary, diagrammatic sectional views depicting the components in the process of FIGS. 1-4 at further stages of the process.
Figure 6:
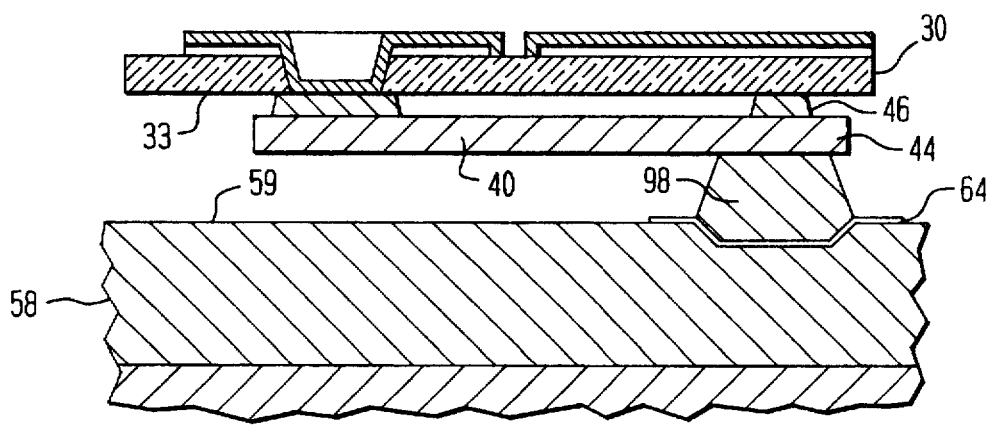

In a heat bonding step 96 (FIG. 1), the top platen 90 is pressed downwardly onto the top surface of sheet 30 (FIGS. 5 and 6). The center section 92 of the top platen forces the sheet down onto the front surfaces of chips 58, and forces the tip end 44 of each lead into engagement with the appropriate chip contact 64. The cartridge is held in the heat bonding press until the temperature of the assembly reaches a temperature required to activate bonding material 48. The bonding material alloys with the gold of leads 40, thereby forming a temporary liquid phase. The liquid phase also bonds with the chip contact 64. As additional gold diffuses into the bonding material, the solidus temperature of the combined material rises and the bonding material solidifies, forming a solid bond 98 (FIG. 6) between the tip end of each lead and the contact 64. Throughout all of these operations, the tip ends of the leads remain secured to sheet 30 and hence remain in place on the sheet. In a variant of this bonding operation, a gas such as air may be introduced under pressure between the top platen 90 and the top surface of the sheet so as to force the sheet downwardly into engagement with the chips.

Figure 1:
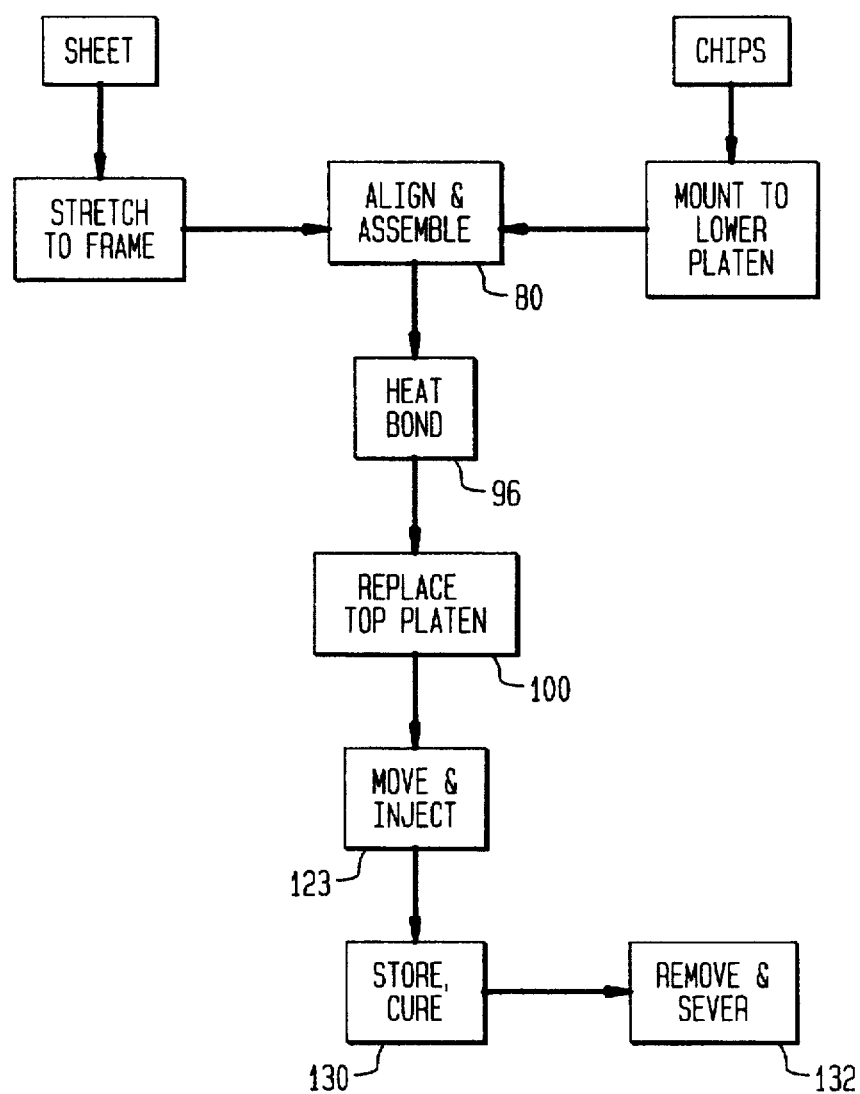
FIG. 1 is a process flow diagram for process in accordance with one embodiment of the invention.
Figure 7:
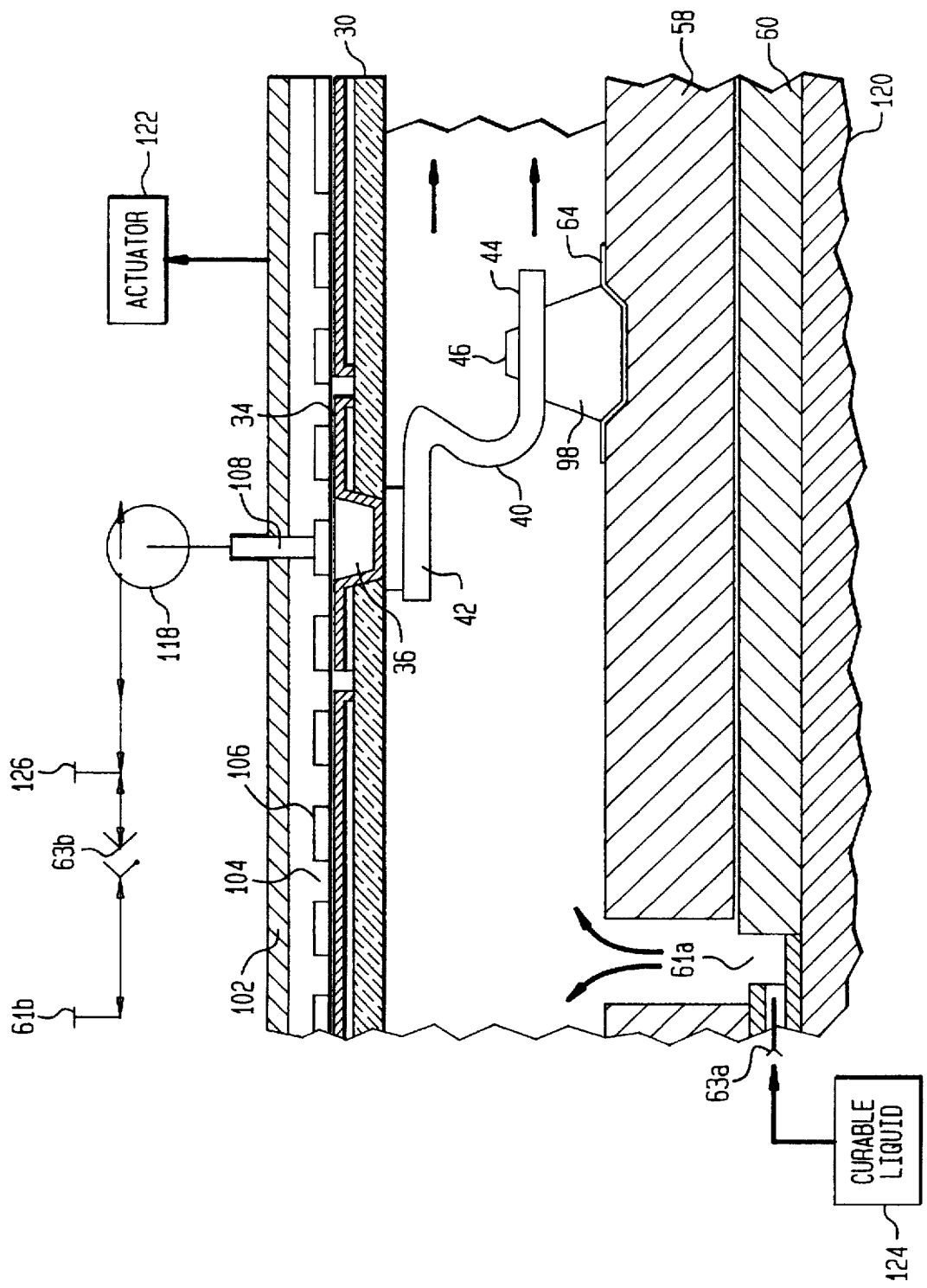
Figure 8:
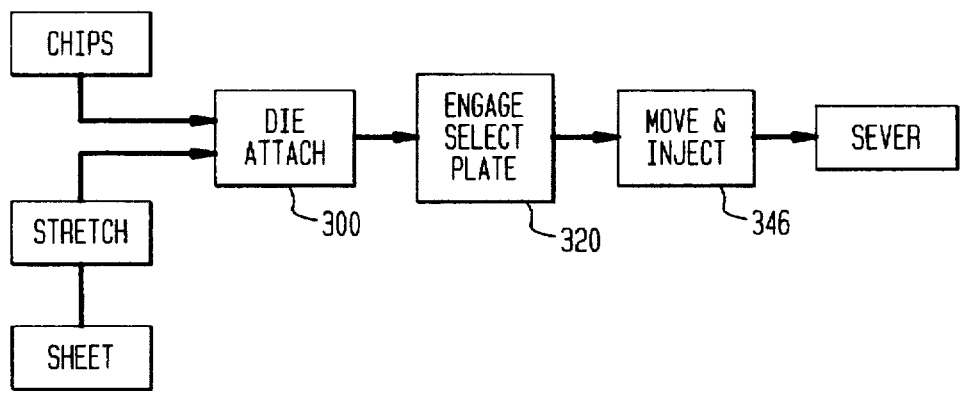
FIG. 8 is a process flow diagram depicting a process in accordance with the embodiment of the invention.

In the next stage 100, the cartridge is removed from the heat bonding press and bonding top platen 90 is replaced by an injection top platen 102 formed from a metal such as aluminum. Bonding top platen 90 is reused with another bottom platen in a further bonding operation. Injection top platen 102 has numerous ridges 104 and channels 106 connected to a port 108. When injection top platen 102 is engaged with sheet 30 and with frame 54, an elastomeric sealing ring 110 (FIG. 2) is engaged between the platen and the top surface of frame 54. At the same time, a further elastomeric sealing ring 112 is engaged between bottom platen 60 and frame 54. Platen 102, frame 54 and platen 60 are clamped together by clamps 94 and advanced to a move and inject operation 123 (FIG. 1). The move and inject station has a vacuum source 118 (such as a conventional vacuum pump, receiver and regulator combination), a base plate 120 and an actuator 122 (FIG. 7). Actuator 122 is adapted to engage injection top platen 102, through conventional linking devices (not shown) and move the so-engaged platen through a predetermined vertical movement away from base plate 120. Base plate 120 in turn is arranged to engage lower platen 60, and may be provided with conventional clamping devices, bolts or other fasteners for ensuring the bottom surface of platen 60 remains in engagement with the base plate 120. The movement and injection station also has a source 124 of a curable liquid. Preferably, the curable liquid, when cured forms a compliant material, such as an elastomeric material or gel. Material such as Dow Corning Sylgard 577 curable silicone gel are preferred.

When the cartridge, including injection top platen 102, frame 54 (FIG. 2) and bottom platen 60 is presented at the movement and injection station, the bottom platen is engaged with the base plate an the top platen is linked to actuator 122. The vacuum port 108 of the top platen is connected to vacuum source 118. The cartridge is engaged in the moving and lifting stations so that the chip-side element or lower platen 60 is engaged with the base plate 120 and so that the sheet-side element or injection top platen is engaged with actuator 122. The vacuum port 108 of top platen 102 is connected to the vacuum source 118 of the moving and lifting station. The curable liquid source 124 is connected to one external opening 63a of the lower platen 60. Accordingly, the curable liquid source is connected to one of the ports 61a in the surface of lower platen 60. The vacuum source 118 is connected, through a valve 126, to another opening 63b of the lower platen and hence connected to another port 61 in the lower platen surface remote from hole 61a. Actuator 122 is engaged to hold the top platen 102 in position, so that the platen bears on frame 54

(FIG. 2) through seal ring 110 and so that the frame bears on lower platen 60 through seal ring 112. In this condition, sheet 30 remains in substantially the same position as illustrated in FIG. 6.

Vacuum source 118 is actuated to remove air from between the sheet and platen 102. Valve 126 is opened to connect port 63b and hence hole 61b with the vacuum source. As the vacuum source withdraws air from the space between sheet 30 and lower platen 60, liquid source 124 is actuated to inject the liquid through port 63a and into the space through hole 61a. Valve 126 is closed to block the path to the vacuum source. While the liquid is being injected, actuator 122 is engaged to pull the upper platen 102 or sheet-side element upwardly away from the chip-side element or lower platen 60. Sheet 30 is held against upper platen 102 by the combined effect of the pressurized liquid being injected between the sheet and lower platen and the vacuum maintained in the grooves 106 of the top platen.

As the sheet-side element moves upwardly, each terminal 34 and each via liner 36 moves upwardly, so that the terminal ends 42 of the leads move upwardly. Actuator 122 advances the top platen and hence the sheet 30 and the terminal ends of the leads upwardly through a predetermined vertical extent. The tip ends 44 of the leads, being anchored to the chips 58 remain in their original positions. Thus, each lead 40 is deformed to a curved condition schematically illustrated in FIG. 7. In this condition, the lead has a substantial vertical extent from its contact end 44 to its terminal end 42. During this process, the releasably bonded buttons 46, release from sheet 30, allowing the contact ends 44 of the leads to move away from the sheet. Before actuator 122 is operated to move the top platen upwardly, clamps 94 are disengaged. After upward movement, clamps 94 are reengaged to hold the top platen in position relative to the bottom platen. Ports 63a and 63b are capped, and the cartridge is disengaged from the movement and injection station.

The cartridge is then transferred into a conventional oven or storage and curing unit 130 for a sufficient time to cure the injected liquid and thus form an elastomeric or gel layer surrounding the leads and chips. After curing, the cartridge is advanced to a removal and severance station 132, where top platen 102 is removed. The assembly is severed at the lands 52 on sheet 30 (FIG. 4) and at the aligned gutter spaces 62 (FIG. 3a) between adjacent chips. Thus, both sheet 30 and the compliant layer are cut, so that each chip and the associated portion of sheet 30 form a separate unit. The severing operation can be performed using a conventional saw, knife or punch and die set. Because there is substantial clearance between adjacent chips in the assembly, the severing operation does not involve particularly close tolerances. Moreover, because the is chips are already separate from one another, the severance operation does not require cutting of a silicon wafer. The chips are debonded from the lower platen before the severing operation, by peeling the assembly away from the lower platen, or after severing by peeling the individual units away from the lower platen. The platens and frame are then reused with a further sheet and with additional chips. The equipment used for the process preferably includes numerous lower platens 60, top inject platens 102, and frames 54, and hence includes many cartridges. While one cartridge is engaged at the bonding step 96, another may be processed in the move and inject step 123, whereas many cartridges may be undergoing the curing step 130.

In the methods discussed above, the array of chips assembled on lower platen 60 is handled and bonded to the leads on sheet 30 in a manner similar to the way in which the chips of an entire wafer can be bonded to leads in certain preferred embodiments of the aforementioned '768 application. In a sense, the assemblage of chips on the lower platen acts as a "artificial" or "assembled" wafer. Use of the assembled or artificial wafer, rather than the actual wafer formed during chip fabrication provide several significant advantages. As discussed above, substantial spaces can be provided between adjacent chips. This simplifies both the bonding operation and the subsequent severing operation. Also, the chips utilized in formation of the assembly can be individually pretested using standard chip testing techniques so that bad chips can be excluded from the process. Sheet 30 can be inspected and/or tested prior to the process. If a defect is noted in any region 50 of the sheet, chip 58 is omitted. Preferably, the omitted chip is replaced by a blank or scrap chip of approximately the same size, which is clearly marked as non-functional. This preserves the normal pattern of flow of the curable material during the injection step.

The individual units resulting from the process are substantially similar to those formed in accordance with preferred embodiments of the '768 application. As described in greater detail in the '768 application, the vertically extensive, curved leads and elastomeric layer permit each terminal 34 to move relative to the chip both in horizontal directions parallel to the front face of the chip and in vertical directions towards and away from the front face of the chip. This greatly facilitates testing of the completed assembly and allows compensation for thermal expansion and contraction of the substrate when the assembly is mounted to a substrate with the terminals bonded to contact pads on the substrate.

Figure 9:
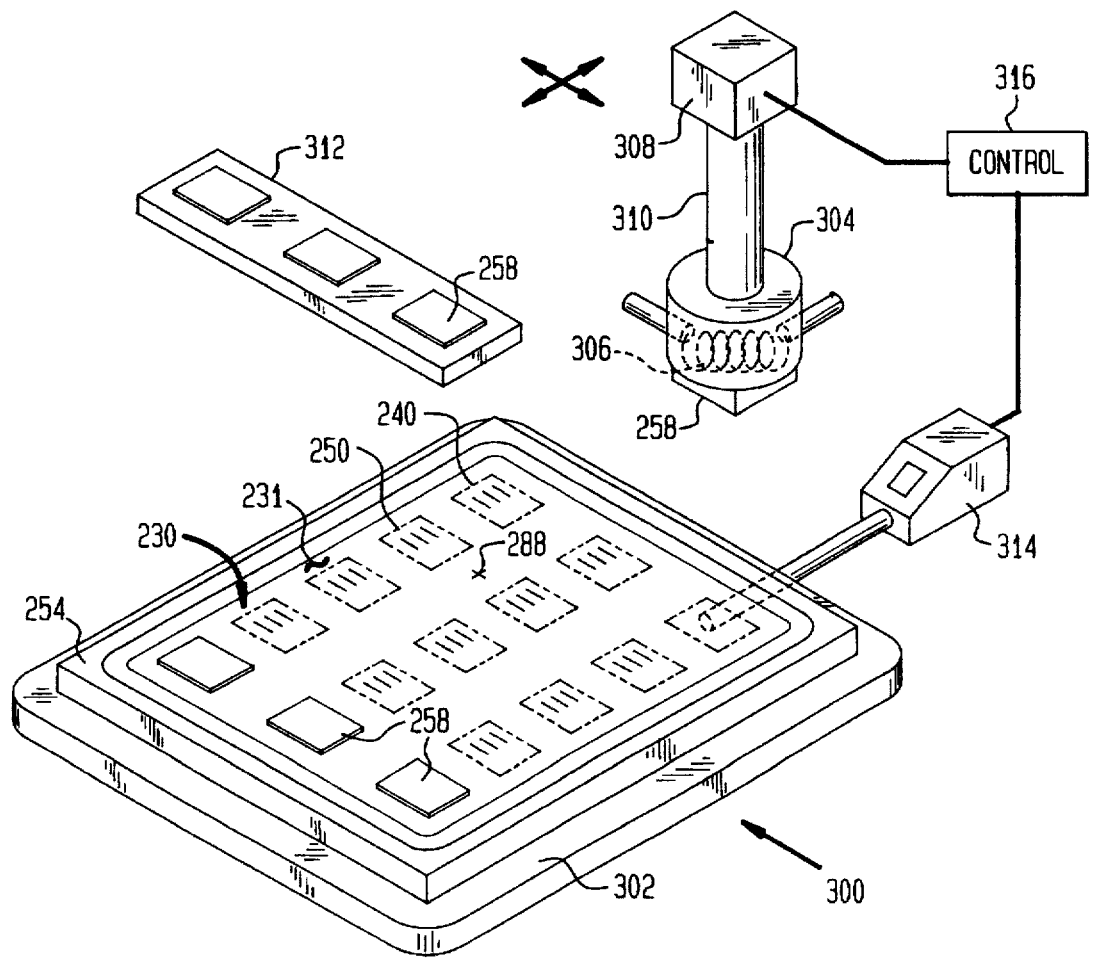
FIG. 9 is a diagrammatic view depicting apparatus utilized in the process of FIG. 8.
Figure 10:
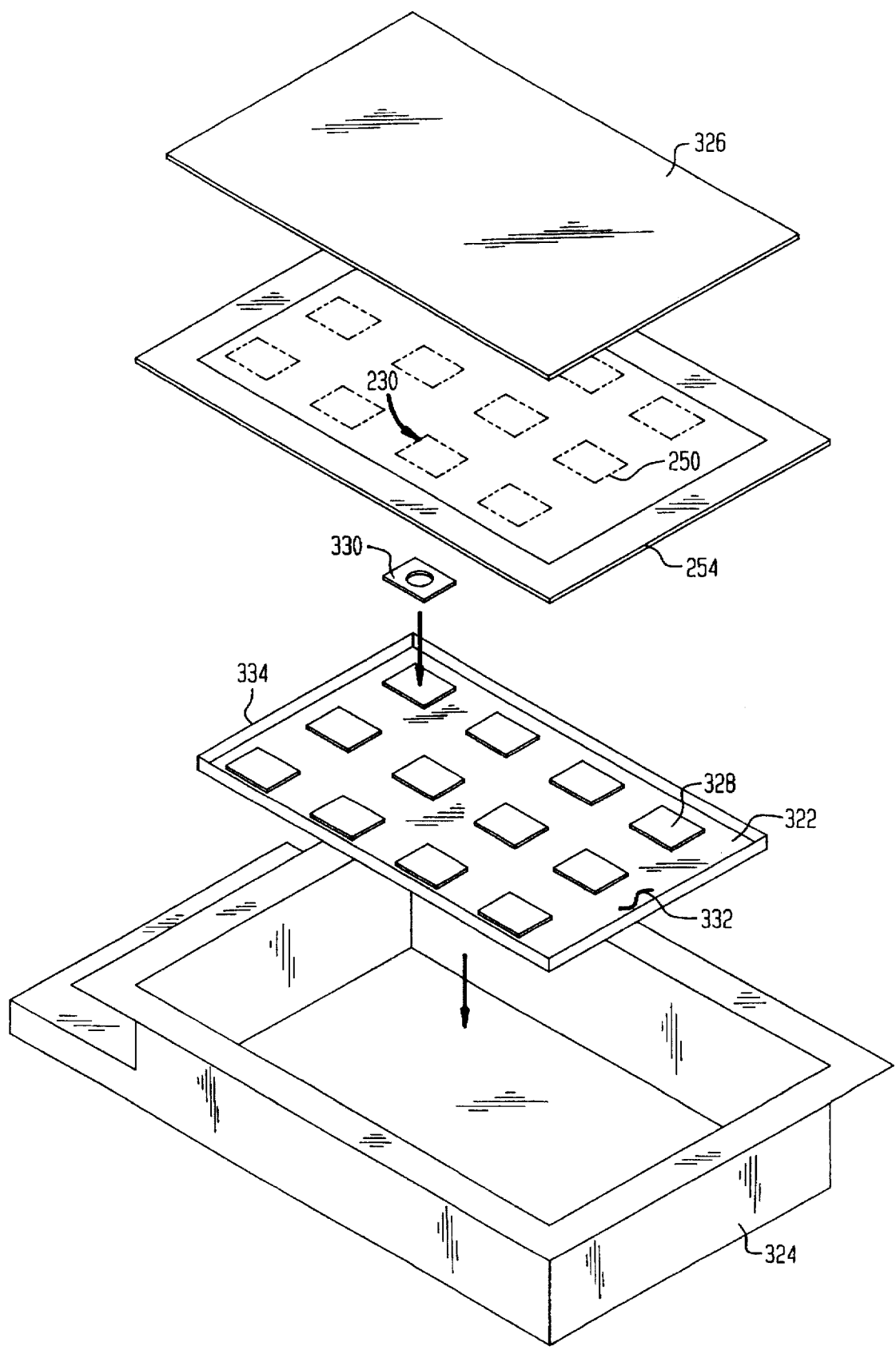
FIG. 10 is an exploded view depicting further elements used in the process of FIGS. 8 and 9.
Figure 11:
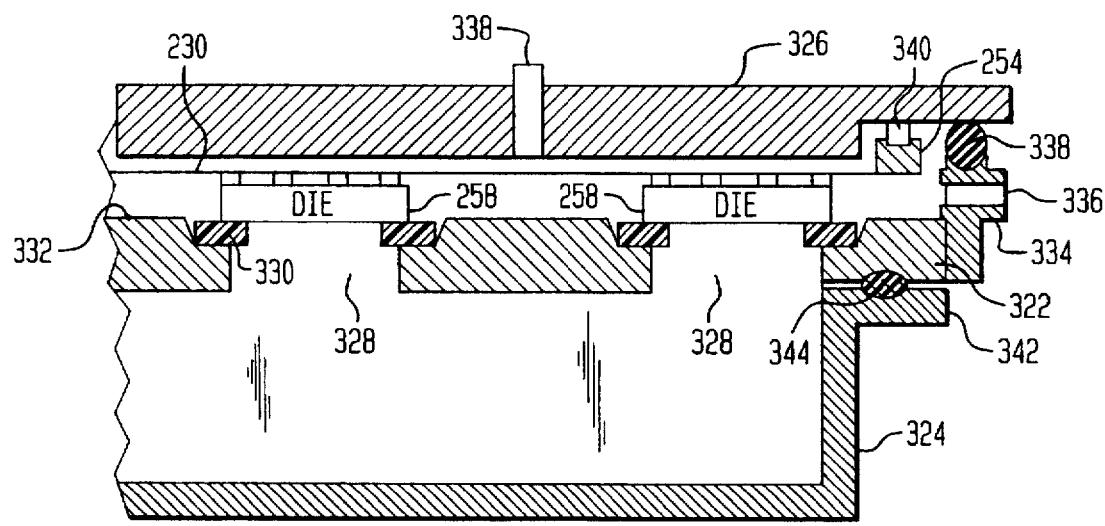
FIG. 11 is a fragmentary sectional view depicting certain components utilized in the process of FIGS. 8-10 during one stage of the process.

In a process according to a further embodiment of the invention, the array of chips is formed on the bottom surface of the sheet. The sheet 230 utilized in this process, has individual regions 250, each corresponding to one chip. Leads 240 are disposed on the lower surface 231 of the sheet in the same manner as discussed above. In the process according to this embodiment, the sheet is stretched and attached to a frame 254 in the same manner as discussed above. In the next stage of the process, the frame and sheet are advanced and placed lower-side-up on a die attach station (FIG. 9). The die attach station includes a base plate 302 and a vacuum chuck 304 with an internal heater 306. The die attach station further includes a pick-and-place mechanism including horizontal actuator 308 and a vertical actuator 310 for moving chuck 304 in three dimensions. The horizontal actuator can move the chuck in horizontal directions parallel to the surface of base plate 302, whereas the vertical actuator moves the chuck towards and away from the base plate. The die attach station further includes a chip infeed station 312 for holding chips to be used in the process. Infeed station 312 may incorporate any conventional chip handling equipment such as racks, conveyors, further vacuum chucks or the like. The die attach station further includes a robot vision system 314 and associated control system 316. Robot vision system 314 is a conventional unit adapted to detect the positions of chips 258 carried by chuck 304 and also to detect the position of fiducial marks 288 on sheet 230.

With the sheet and frame positioned lower-side-up on the base plate 302 of the die attach station, control unit 316 actuates the actuators 308 and 310 to engage the chuck with a single chip 258 in the infeed section and to move the chuck into alignment with one region 250 of the sheet. The chuck is maintained at an elevated temperature, sufficient to actuate the bonding material carried by leads 240. For example, where the bonding material includes tin, the chuck may be maintained at about 305° C. When the hot chip engages the bonding material on the terminal ends of the leads, the bonding material forms a liquid phase. The liquid phase solidifies as further gold from the leads and from the contacts of the chip diffuses into the bonding material. Preferably, actuator 310 urges the chuck downwardly with a substantial force, desirably about 1 to about 4 grams per square mil (about $1.5\times10^3$ gm/mm$^2$ to about $6.2\times10^3$ gm/mm$^2$)of bond area. The bond area is the total area of all of the bonding material masses in the horizontal plane.

In this operation, each chip is individually aligned and bonded with the tip ends of the leads in one region 250. After chips have been bonded to all good regions 250, scrap chips are bonded to any defective regions. In the next stage of the process 320, a complete cartridge assembly is formed by assembling a select plate 322 (FIGS. 10 and 11), a lower platen in the form of a vacuum plenum 324 and an upper platen 326 with the frame 254 and sheet 230. Select plate 322 is a generally flat plate having holes 328 arranged in a pattern corresponding to the pattern of regions 250 on sheet 230 and hence corresponding to the pattern of chips 258 in the array of chips on the sheet. A gasket 330 is disposed around the periphery of each hole 328. Each gasket is recessed slightly into the top surface 332 of the plate, so that the top surface of the gasket is substantially flush with the top surface of the plate. Select plate 322 further has a rim 334 protruding upwardly from the top surface 332 and ports 336, of which one is visible in FIG. 11, open to the space above top surface 332. The top edge of rim 334 is equipped with a flexible, compressible gasket 338. Top platen 326 is provided with a vacuum port 338 communicating with the space between the platen and the sheet 230. A gasket 340 is engaged between top platen 326 and frame 254. The top platen further engages flexible gasket 338, so that the top platen is sealed to rim 334 and thus sealed to select plate 322.

Vacuum plenum 324 has a flange 342, and a further gasket 334 is disposed between the flange and the select plate. All of these parts are engaged with one another to form a cartridge, and clamped together by appropriate clamps (not shown). The cartridge may also include locating pins and holes, or other locating elements, for assuring that the elements of the cartridge do not move horizontally relative to one another. Because the chips are already attached to the leads when the select plate is engaged with the chips, there is no need for precise registration of the select plate with the chips. Provided that each chip engages the appropriate gasket 330 on the select plate, the assembly will function properly. Stated another way, the position of each chip relative to the select plate and the position of the select plate relative to frame 254 and sheet 230 plays in no role in establishing registration between the chip contacts and the leads; that registration is established by appropriate placement of chuck 304. Thus, the select plate can be assembled to the frame and sheet manually, or using a simple fixture to assure that the select plate does not move the chips horizontally during engagement. This assembly can be formed while the sheet and frame rest on the base plate 302 of the die attach station. Alternatively, the sheet and frame can be picked up, with the chips attached thereon, inverted and placed onto the select plate. The temporary attachment between the tip ends of the leads and the bottom surface of the sheet normally will have sufficient strength to support the weight of the individual chips.

After the cartridge has been assembled, it is advanced to a move and inject station 346 (FIG. 8) similar to the move and inject station discussed above with reference to FIG. 7. The vacuum system of the move and inject station is actuated to apply a vacuum within plenum 324 and thus apply a vacuum through each hole 328 in the select plate. The vacuum system further applies a vacuum through port 338 and hence holds sheet 230 against the top platen. Here again, after evacuating air through some ports 336, the move and inject station applies a curable liquid through other ports 336 and hence applies the curable liquid between the lower surface of sheet 230 and the upper surface 332 of the select plate. At the same time, the move and inject station raises top platen 326 away from the select plate 322 and hence away from the chips 258. Because the terminal end of each lead is secured to sheet 230 and the tip end is bonded to a chip 258, the leads are again deformed in the manner discussed above. Following movement and injection, the elements of the assembly are again clamped in place and transferred to a storage unit for curing of the liquid to form the elastomeric layer. Here again, following curing the sheet and the dielectric layer are severed so as to leave individual units, each including one chip and an associated portion of the dielectric sheet with electrical terminals thereon connected to the contacts of the chip by the deformed leads.

Figure 12:
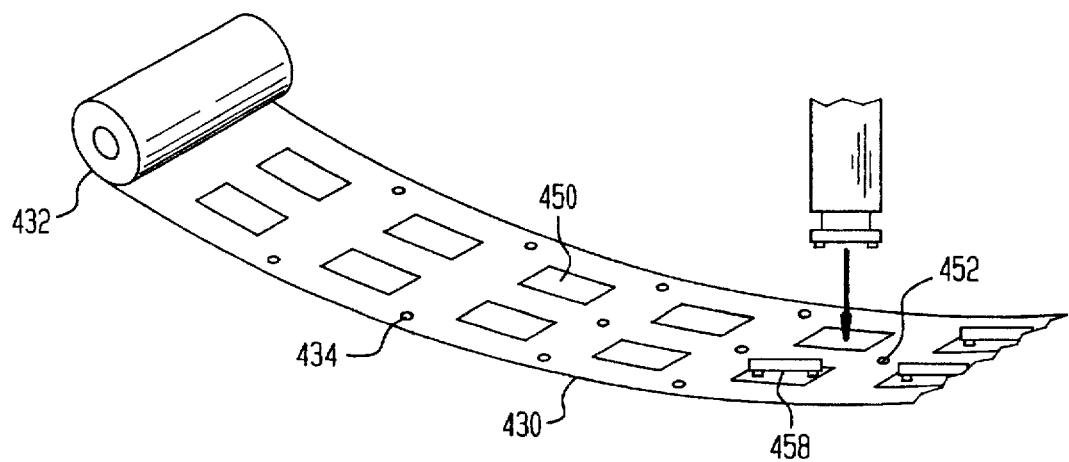
FIG. 12 is a diagrammatic perspective view depicting components used in a process according to a further embodiment of the invention.

In a further variant of the process discussed above with reference to FIGS. 8–11, the individual chips are attached to the sheet without first stretching the sheet or attaching it to the frame. For example, the sheet 430 (FIG. 12) can be fed from a continuous or semicontinuous roll 432. For this purpose, the sheet 430 may be provided with sprocket holes 434 registered with the individual lead-bearing regions 450 of the sheet. The sprocket holes can be used to register the continuous tape-like sheet 430 in substantially the same way as sprockets on conventional tape automated bonding tapes are used for registration. The sheet or tape may further be provided with fiducial marks 452 in precise registration with the individual lead-bearing regions 450. These may be used in conjunction with an optical system for precisely registering a chuck 404 with the leads. After attachment of the individual chips 458, the sheet and chips may be engaged with a select plate as discussed above with reference to FIGS. 10–11 and processed in a similar manner. A frame (not shown) may be attached to the sheet before such assembly, to provide a vacuum-tight seal around the edges of the sheet.

As numerous other variations and combinations of the features discussed above can be utilized without departing from the present invention as defined by the claims, the foregoing description of the preferred embodiment should be taken by way of illustration rather than by way of limitation of the invention defined by the claims. Merely by way of example, in the embodiment of FIGS. 1–7, the individual chips can be held to the bottom platen by vacuum rather than by way of adhesive. The bottom platen may be provided with holes and gaskets similar to those utilized in the select plate of FIGS. 10–11. Conversely, the select plate of FIG. 10–11 may be replaced by an adhesive-coated platen. Also, a continuous film may be applied over the bottom surfaces of the chips, and bonded to the bonded to the back or non-contact bearing surfaces of the chips. The film may be held against the bottom platen by vacuum in substantially the same way as sheet 30 (FIG. 7) is held against the top button by vacuum. This continuous film may be severed along with the dielectric sheet and compliant layer after the process is complete, so that a portion of the film remains as a part of each completed assembly.

In each of the arrangements discussed above, the bonding material bumps, or the contacts on the individual chips, may vary somewhat in height. The ability of the bonding material to flow, especially under the pressure applied during the bonding process aids in compensating for these disparities and in ensuring that all of the tip ends of all of the leads will be bonded. Where a tin bonding material is employed, appropriate precautions, known in tin-gold eutectic bonding generally, should be employed. Thus, the tin-gold eutectic bond, and the tin bonding material prior to bonding, should be isolated from copper to avoid diffusion of copper into the tin. Also, the solidified bond material desirably is less than about 20 percent by weight tin, the remainder gold, to provide enhanced resistance to repeated stress. Further, the amounts of tin and gold present in the system should be selected so that no pure tin is left at any bond. Pure tin has been known to form so-called "whiskers" or metal growths which extend from the surface of the pure tin. Such whiskers can cause undesirable electrical properties such as noise, and in an extreme case, shorting to adjacent contacts.

The dimensions and materials of the leads and related features may be in accordance with the preferred embodiments disclosed in the aforementioned '768 application. Thus, each lead may be between about 200 and about 1000 microns long, about 10 microns to about 25 microns thick and about 10 microns to about 50 microns wide. The vertical movement of the elements during the lead-forming steps should not be so great as to entirely straighten each of the curved leads. As also disclosed in the '768 application, the leads, in their initial, undeformed condition, may be straight. In this arrangement, the sheet and chips are moved relative to one another in a horizontal direction as well as in a vertical direction, so that the tip end of each lead moves horizontally toward the terminal end. Also, bonding materials and methods other than those discussed above can be used to attach the tip ends of the leads to the terminals on the chips. Thus, the tip ends can be bonded by diffusion bonding without formation of a liquid phase or by using a solder or metal-bearing polymeric composition. Bonding materials can be applied by methods other than plating as, for example, by dipping the lead tip ends, by silk screening, or by application of a paste. The conductive bonding material may be provided on the contacts of the chips, rather than on the lead tip ends. Alternatively, bonding methods which do not require a distinct bonding material may be employed. Examples of such bonding methods are such as thermosonic and thermocompression bonding of the lead tip ends to the contacts. Materials other than gold, such as silver, copper and brass may be employed for the leads. Metals other than copper can be used in the terminals, conductive layer and via liners.

The leads can be initially disposed on the chips, with the tip ends bonded to the contacts of the chip. In this arrangement, the terminal ends are bonded to the terminals on the dielectric sheet prior to movement of the sheet and chip array.

The cartridge arrangement discussed above can be used in processes where an entire wafer is handled as a unit, rather than as separate chips. As disclosed in certain embodiments of the '768 application, the chips in an entire wafer, or in a portion of the wafer, can be connected to the terminals on a dielectric sheet by a lead-bonding and lead-deforming process. To process an entire wafer, the lower platen or select plate of the cartridges discussed above is modified to hold the entire wafer, whereas the lead-bearing regions of the dielectric sheet are arranged at spacings corresponding to the spacings of the chips on the wafer.

Figure 13:
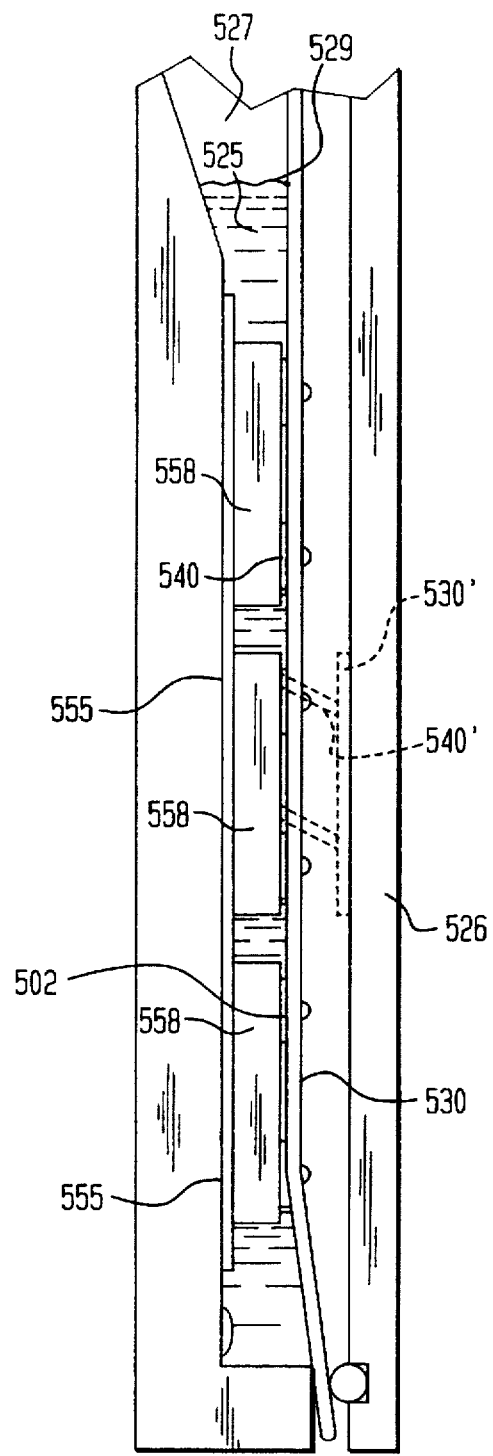
FIG. 13 is a diagrammatic sectional view depicting components utilized in a process according to yet another embodiment of the invention.

In the processes discussed above, the pressure of the liquid encapsulating material during the movement and injection steps assists in moving the dielectric sheet upwardly away from the semiconductor chips, and helps to retain the sheet in engagement with the upper platen or sheet-side element of the fixture as such element is moved upwardly. In a process according to a further embodiment of the invention, the upward movement of the sheet-side element may be impelled entirely by the pressure of the liquid encapsulant. The upward movement of the sheet-side element should be arrested when the sheet-side element reaches a preselected position relative to the semiconductor chips, as by a mechanical stop. In processes according to a further embodiment of the invention, the dielectric sheet 530 (FIG. 13) may be out of contact with the upper platen or sheet-side element 526 at the beginning of the moving step, and may be forced upwardly into contact with the upper platen or sheet-side element by the pressure of the liquid encapsulant 525 introduced between the dielectric sheet and the lower platen or chip-side element. Here again, the assembly includes leads 540. Prior to the moving step, the leads are disposed in generally horizontal orientation. As the sheet is forced upwardly to the position illustrated in broken lines at 530', each of the leads is deformed to a vertically extensive configuration, as illustrated in broken lines at 540'. The extent of such upward motion is controlled by the spacing between the upper platen and the chips. Thus, the liquid encapsulant 525 serves as a fluid under pressure which drives the dielectric sheet upwardly away from the semiconductor chips through a predetermined displacement, and which deforms the leads in a predetermined manner. As described in greater detail in the commonly assigned United States Patent Application of Craig Mitchell et al entitled Microelectronic Encapsulation Methods and Equipment, filed on even date herewith, which is incorporated by reference herein, a liquid encapsulant may be pressurized by a gas introduced into the fixture above the level of the liquid encapsulant. Thus, the fixture or cartridge may be tilted to a vertical orientation in which the sheet and the array of semiconductor chips extend generally vertically, as illustrated in FIG. 13. The gas 527 may be applied above the meniscus or liquid level 529 of the encapsulant. The cartridges utilized in the present process may be fixtures in accordance with the aforesaid Mitchell provisional patent application. As further described in the Mitchell application, the dielectric sheet may have openings therein, and these openings may be closed by a top covering layer to protect the top surface of the dielectric sheet and the terminals from encapsulant contamination. Also, a bottom covering layer 555 may be provided beneath the bottom surfaces 558 of the chips, and may adhere to the bottom surfaces of the chips, so as to protect the bottom surfaces of the chips from encapsulant contamination. The pressurized encapsulant may also be employed to move the dielectric sheet where all of the chips are provided as an integrated wafer, or where other microelectronic elements are provided instead of chips. This technique may also be employed where the flexible dielectric sheet is replaced by a rigid dielectric panel or other element.

A process according to a further embodiment of the invention includes a sheet 630 incorporating individual regions 650. Leads 640 are disposed on the lower surface 631 of the sheet. In this embodiment, each region 650 of the sheet corresponds to an entire multi-chip module rather than a single chip. Leads 640 within each region are interconnected to one another and to terminals 634 on the top-side of the sheet. Sheet 630 includes internal connecting leads 635 extending in horizontal directions parallel to the surfaces of the sheet within each region 650. Thus, sheet 630 may be a multi-layer sheet having connecting leads 635 disposed between the various layers and having vias connecting the various leads to one another, to terminals 634 and to leads 640 as required by the individual circuit. Each region 650 of sheet 630 is bounded by vacant spaces or scribe lands 652. The connecting leads 635 do not extend across the scribe lands 652.

Figure 14:
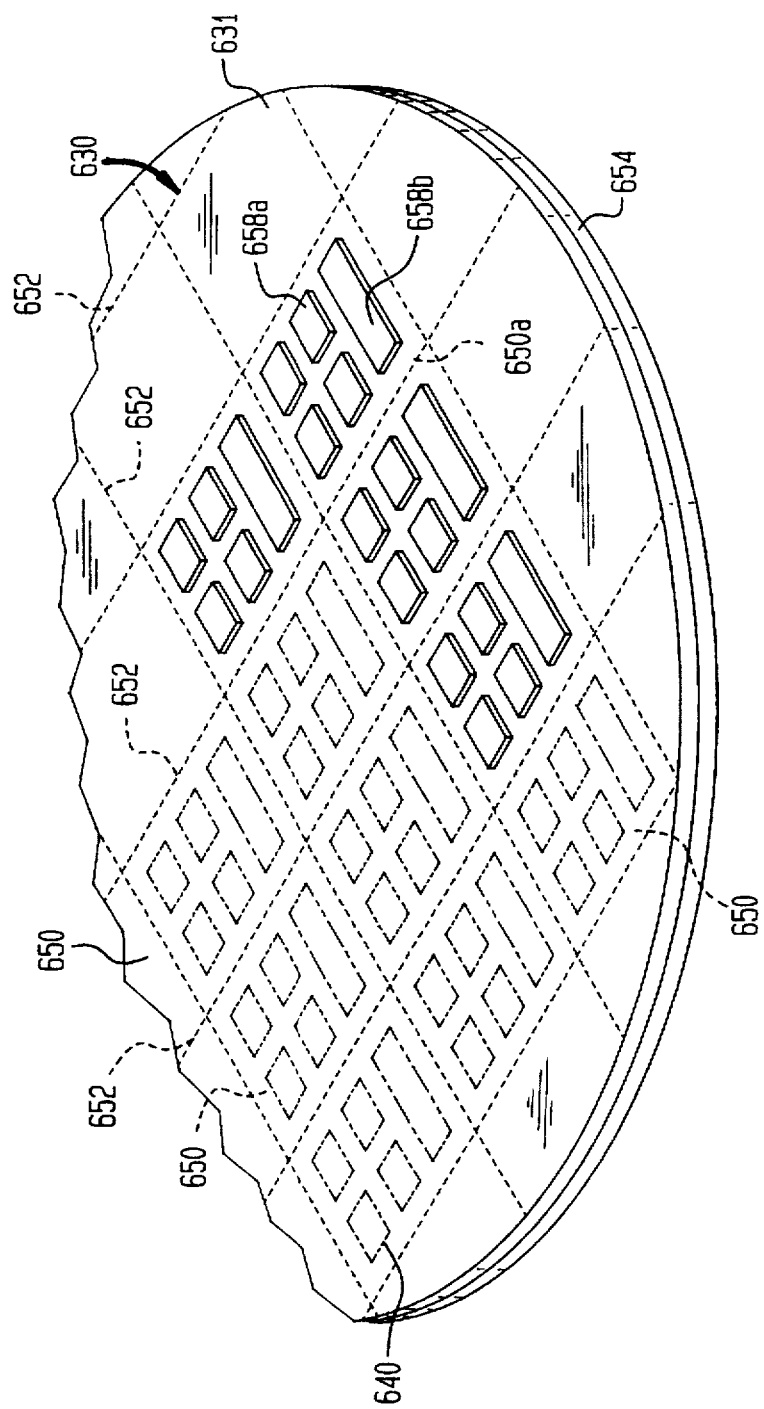
FIG. 14 is a diagrammatic perspective view depicting components in accordance with a further embodiment of the invention.
Figure 15:
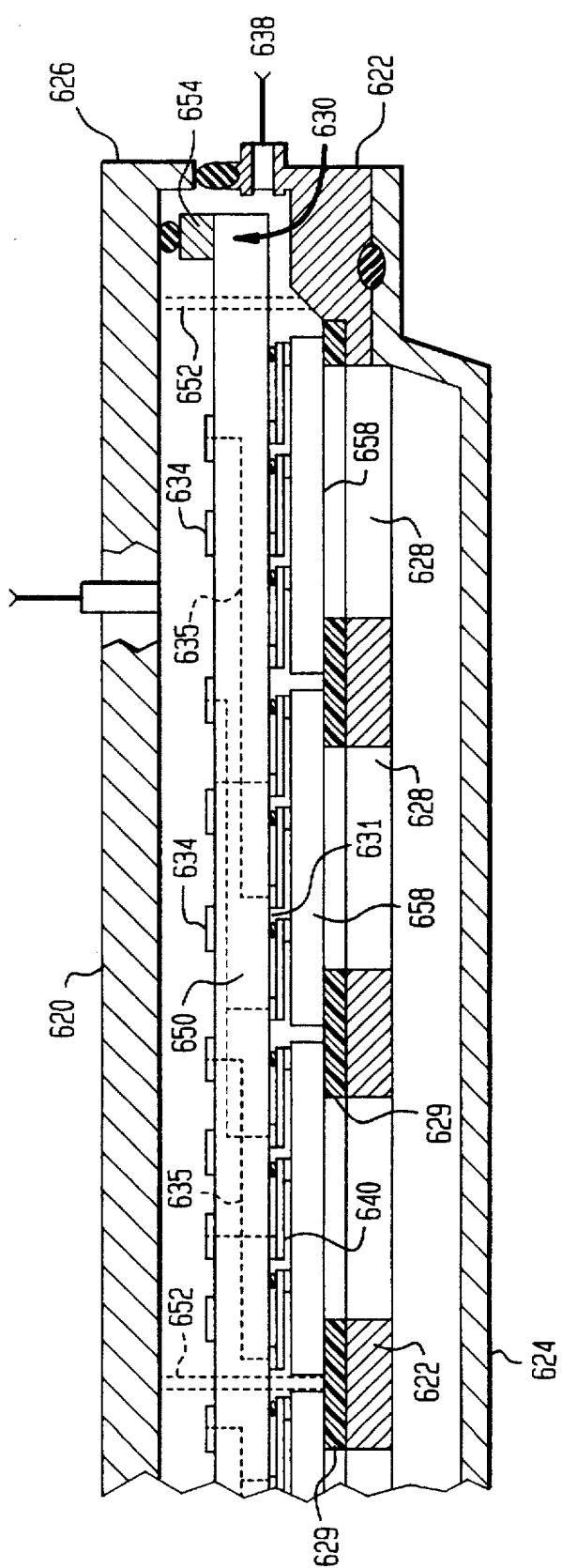
FIG. 15 is a diagrammatic sectional view depicting the components of FIG. 14 in a later stage of the process, together with other components.

Sheet 630 is stretched and attached to a frame 654 in the manner discussed above. As illustrated in FIG. 14, frame 654 may be a circular ring. In the same manner as described above with reference to FIGS. 8–11, individual chips 658 are attached to the sheet. The chips attached to each region may be same or may include different chips as required to constitute the multi-chip module. For example, as illustrated in FIG. 14, chips 658a and 658b attached to region 650a are of different sizes and internal structures. In the same manner as described above, the robot vision system of the die attach station positions each chip in alignment with the proper portion of a region 650. The heated chuck of the die attach station engages the chips with the sheet and bonds the contacts on each chip with the bonding material carried by the tips of leads 640. Here again, after bonding of the chips, a select plate 622, lower vacuum plenum 624 and upper platen 626 are assembled with the sheet 630 and support ring 650. In this arrangement as well, the chips bear on gaskets 629 mounted on the select plate, surrounding holes 628 in the plate. Here again, the top platen 626 is sealingly engaged with select plate 622 and bottom platen 624. Frame 654 is sealingly engaged with the top platen 626 through a gasket disposed therebetween. Once again, all these parts are clamped together by appropriate clamps or other mechanical devices to form a cartridge.

After the cartridge has been assembled, it is advanced to the move and inject station where a vacuum is applied within lower platen 624 to hold the chips 658 onto the select plate 622. A vacuum is also applied between sheets 630 and upper platen 626. A curable liquid is injected between select plate 622 and sheet 630 through a port 638. At the same is time, the move and inject station lifts the upper platen 626 away from select plate 622 thus lifting the sheet 630 away from chips 658 and deforming leads 640. Here again, the tips of the leads 640 attached to the chips break away from the lower surface of the sheet 630 during this moving process. In the same manner as discussed above, the moving process deforms the leads into upwardly extending, preferably curved configurations. The curable liquid material surrounds the leads and fills the spaces between the chips and the sheet. After curing, sheet 630 is severed at scribe lands 652, thus separating each of the individual multi-chip modules. The resulting multi-chip modules have chips spaced apart from the sheet and have flexible leads extending between the chips and the sheet. As in the embodiments discussed above, the flexible leads and the cured, compliant material can compensate for thermal expansion differences and can also compensate for misalignment between the chips and the sheet. The multiple chips of each module may be secured to a common heat sink or thermally conductive element. (not shown).

As these and other variations and combinations of the features discussed above can be utilized without departing from the present invention as defined by the claims, the foregoing description of the preferred embodiments should be taken as illustrating, rather than limiting, the invention as claimed.

What is claimed is:

1. A method of making a plurality of semiconductor chip assemblies comprising the steps of:

(a) providing an array including a plurality of separate semiconductor chips each having a contact-bearing surface and contacts on such surface, the contact-bearing surfaces of said chips facing in a common direction and defining a first surface of the array, a dielectric element overlying the first surface of the array and a plurality of elongated leads disposed between said array of chips and said dielectric element, each said lead having a first end fastened to said dielectric element and a second end fastened to a chip in said array; and (b) forming the leads by moving said dielectric element and said array relative to one another to simultaneously displace all of said first ends of said leads relative to said second ends.

2. A method as claimed in claim 1 wherein said dielectric element includes a flexible dielectric sheet having terminals thereon, the first ends of said leads being connected to said terminals.

3. A method as claimed in claim 2 wherein said providing step includes the steps of providing said sheet with said leads thereon secured to said terminals, then juxtaposing said sheet with said chips and then bonding said leads to said contacts of said chips.

4. A method as claimed in claim 2 wherein providing step includes the steps of providing said chips with said leads thereon secured to said contacts of said chips, then juxtaposing said sheet with said chips, and then bonding said leads to said terminal structures on said sheet.

5. A method as claimed in claim 1 further comprising the step of subdividing said sheet after said moving step so as to form a plurality of units, each including one said chip and a portion of said sheet.

6. A method as claimed in claim 1 wherein said step of providing said chips in an array includes the step of providing spaces between adjacent chips in the array.

7. A method as claimed in claim 1 wherein said step of providing said chips in said array includes the step of testing said chips and assembling said array using only chips which pass the test.

8. A method as claimed in claim 1 wherein said step of providing said chips in said array includes the step of placing individual chips on a holding element so that the first surface of each chip faces away from the holding element and temporarily fixing said chips to said holding element, said chips remaining fixed to said holding surface during said step of forming said leads.

9. A method as claimed in claim 8 further comprising the step of detaching said chips from said holding element after said forming step.

10. A method as claimed in claim 9 further comprising the step of subdividing said dielectric element after said forming step so as to leave a portion of said dielectric element connected to each chip and thereby form units each including one chip and the associated portion of said dielectric element.

11. A method as claimed in claim 8 wherein said step of providing includes the step of providing said sheet with said leads secured to said terminals before said juxtaposing step, and bonding said leads to said contacts of said chips after said sheet is juxtaposed with said array of chips.

12. A method as claimed in claim 8 wherein said step of providing includes the step of providing said chip array with said leads secured to said contacts of said chips before said juxtaposing step, and bonding said leads to said terminal structures on said sheet after said sheet is juxtaposed with said array of chips.

13. A method as claimed in claim 11 or claim 12 further comprising the step of aligning said sheet with said chips of said array by moving said holding element and said sheet relative to one another.

14. A method as claimed in claim 1 wherein said providing step includes the step of attaching said chips to said sheet in a plurality of separate operations.

15. A method as claimed in claim 14 wherein said step of attaching said chips to said sheet includes the step of bonding leads between each chip and the sheet.

16. A method as claimed in claim 15 further comprising the step of temporarily securing said chips to a holding element after chips have been attached to said sheet, said step of moving said sheet and chips relative to one another including the step of moving said holding element relative to said sheet.

17. A method as claimed in claim 16 wherein said step of attaching said chips to said sheet includes the steps of heating said chips, holding each heated chip in a chuck and advancing the chuck towards the is sheet while controlling registration of the chuck relative to the sheet to thereby register the contacts of the chip with the sheet, and wherein said step of bonding said leads includes the step of activating a bonding material by means of heat transfer from each said chip.

18. A method as claimed in claim 17 wherein only one said chip is held in said chuck during each advancement thereof, so that each said chip is independently registered with the sheet.

19. A method of making a microelectronic element comprising the steps of:

(a) providing a microelectronic element having a contact-bearing surface and contacts on such surface, a dielectric element overlying the contact-bearing surface and a plurality of elongated leads disposed between said microelectronic element and said dielectric element, each said lead having a first end fastened to said dielectric element and a second end fastened to said microelectronic element; and (b) introducing a liquid encapsulant under pressure between said microelectronic element and said dielectric element so that liquid encapsulant forces said dielectric element upwardly away from said microelectronic element, thereby simultaneously displacing all of said first is ends of said leads relative to said second ends and deforming the leads.

20. A method as claimed in claim 19 wherein said providing step includes the step of providing a an array including plurality of said microelectronic elements each having a contact-bearing surface, the contact-bearing surfaces of said microelectronic elements facing in a common direction and defining a first surface of the array, said dielectric element overlying said first surface of said array, there being leads connected between each of said microelectronic elements and said dielectric element, so that the leads connected to all of said microelectronic elements are deformed simultaneously.

21. A method as claimed in claim 20 wherein said dielectric element includes a flexible dielectric sheet having terminals thereon, the first ends of said leads being connected to said terminals.

22. A method as claimed in claim 21 wherein said dielectric sheet is in engagement with a sheet-side fixture element during said introducing step, whereby said encapsulant under pressure impels the sheet-side fixture element away from the microelectronic elements.

23. A method as claimed in claim 22 further comprising the step of arresting movement of said sheet-side fixture element at a predetermined position relative to said microelectronic elements.

24. A method as claimed in claim 21 wherein further comprising the step of providing a sheet-side fixture element at a predetermined position relative to said microelectronic elements, said dielectric sheet being remote from the sheet-side fixture element at the beginning of said introducing step, said liquid encapsulant forcing said sheet into engagement with the sheet-side fixture element and thereby forcing said sheet to a predetermined position relative to said microelectronic elements.

25. A method as claimed in claim 20 wherein said array of microelectronic elements includes a plurality of separately formed elements.

26. A method as claimed in claim 20 wherein said array of microelectronic elements includes a plurality of semiconductor chips formed as an integral wafer.

* * * * *

UNITED STATES PATENT AND TRADEMARK OFFICE
CERTIFICATE OF CORRECTION

PATENT NO. : 5,798,286  Page 1 of 3
DATED     : August 25, 1998
INVENTOR(S) : Faraci et al.

It is certified that error appears in the above-identified patent and that said Letters Patent is hereby corrected as shown below:

Column 1, line 57, delete "is".

Column 2, line 29, delete "is".

Column 3, line 1, delete "is".

Column 6, line 39, delete "is".

Column 6, line 61, "FIGS." should read --FIG.--.

Column 6, lines 65, delete "a" (second occurrence).

Column 8, line 3, "geranium" should read --germanium--.

Column 8, line 22, delete "a".

Column 9, line 43, "a" should read --an--.

Column 10, line 47, "are" should read --is--.

Column 10, line 51, "an" should read --and--.

Column 11, line 30, "46, release" should read --46 release--.

UNITED STATES PATENT AND TRADEMARK OFFICE
CERTIFICATE OF CORRECTION

PATENT NO. : 5,798,286
DATED : August 25, 1998
INVENTOR(S) : Faraci et al.

It is certified that error appears in the above-identified patent and that said Letters Patent is hereby corrected as shown below:

Column 12, line 5, "a" should read --an--.

Column 12, line 7, "provide" should read --provides--.

Column 13, line 52, delete "in".

Column 14, line 57, delete "to the bonded".

Column 17, line 36, delete "is".

Column 19, line 18, delete "is".

UNITED STATES PATENT AND TRADEMARK OFFICE
CERTIFICATE OF CORRECTION

PATENT NO. : 5,798,286
DATED : August 25, 1998
INVENTOR(S) : Faraci et al.

It is certified that error appears in the above-identified patent and that said Letters Patent is hereby corrected as shown below:

Column 20, line 1, delete "is".

Column 20, line 4, delete "a".

Column 20, line 27, delete "wherein".

Signed and Sealed this

Fourth Day of May, 1999

Attest:

Q. TODD DICKINSON

*Attesting Officer*     *Acting Commissioner of Patents and Trademarks*